US009040380B2

(12) United States Patent
Hu et al.

(10) Patent No.: US 9,040,380 B2
(45) Date of Patent: May 26, 2015

(54) INTEGRATED CIRCUITS HAVING LATERALLY CONFINED EPITAXIAL MATERIAL OVERLYING FIN STRUCTURES AND METHODS FOR FABRICATING SAME

(71) Applicant: GLOBALFOUNDRIES, Inc., Grand Cayman, KY (US)

(72) Inventors: Xiang Hu, Clifton Park, NY (US); Jin Ping Liu, Ballston Lake, NY (US); Jill Hildreth, Slingerlands, NY (US); Taejoon Han, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/023,558

(22) Filed: Sep. 11, 2013

(65) Prior Publication Data

US 2015/0069515 A1    Mar. 12, 2015

(51) Int. Cl.
*H01L 21/336* (2006.01)
*H01L 21/02* (2006.01)
*H01L 21/8234* (2006.01)
*H01L 29/66* (2006.01)
*H01L 29/78* (2006.01)

(52) U.S. Cl.
CPC .. *H01L 21/823431* (2013.01); *H01L 29/66795* (2013.01); *H01L 29/785* (2013.01)

(58) Field of Classification Search
USPC .......... 438/269, 300, 417, 607; 257/382–389, 257/E21.09–E21.134
See application file for complete search history.

(56) References Cited

U.S. PATENT DOCUMENTS

| | | | | |
|---|---|---|---|---|
| 8,481,379 B2 * | 7/2013 | Liang et al. | | 438/183 |
| 8,637,931 B2 * | 1/2014 | Basker et al. | | 257/347 |
| 8,652,932 B2 * | 2/2014 | Adam et al. | | 438/424 |
| 8,659,097 B2 * | 2/2014 | Mor et al. | | 257/401 |
| 8,765,533 B2 * | 7/2014 | Hsieh et al. | | 438/151 |
| 8,802,513 B2 * | 8/2014 | Reznicek et al. | | 438/157 |

* cited by examiner

*Primary Examiner* — Calvin Lee
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes providing a fin structure overlying a semiconductor substrate. The fin structure defines a fin axis extending in a longitudinal direction perpendicular to a lateral direction and has two fin sidewalls parallel to the fin axis. The method includes forming gate structures overlying the fin structure and transverse to the fin axis. Further, the method includes growing an epitaxial material on the fin structure and confining growth of the epitaxial material in the lateral direction.

20 Claims, 5 Drawing Sheets

INTEGRATED CIRCUITS HAVING LATERALLY CONFINED EPITAXIAL MATERIAL OVERLYING FIN STRUCTURES AND METHODS FOR FABRICATING SAME

TECHNICAL FIELD

The technical field generally relates to integrated circuits and methods for fabricating integrated circuits, and more particularly relates to integrated circuits with epitaxial material overlying fin structures and methods for fabricating such integrated circuits.

BACKGROUND

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved.

One known type of non-planar, multi-gate transistor, commonly referred to as a "FinFET," includes two or more parallel fins ("fin structures") formed on a semiconductor substrate and extending in a longitudinal direction. FinFETs further include at least one conductive gate structure that is formed over the fin structures and generally extends in a lateral direction perpendicular to the longitudinal direction. Source and drain regions are formed in each fin structure on opposite sides of the gate structure. The gate extends across and over the fin structures such that an intermediate region of the gate conformally overlays three surfaces of each fin structure (i.e., an upper surface, a first sidewall surface, and a second opposing sidewall surface of each fin). Because the gate structure surrounds the fin structure on three surfaces, the FinFET essentially has three gates controlling the current through the fin structure or channel region. These three gates provide three channels for electrical signals to travel, thus effectively increasing the conductivity per unit surface area as compared to a conventional planar transistor.

While providing the advantages noted above, FinFETs and other non-planar multi-gate devices utilizing fin structures (e.g., TriFETs) can be somewhat difficult to fabricate due to their unique topographies, particularly at advanced technology nodes. One particular difficulty is encountered when forming contacts at the source and drain regions. Specifically, as pitch shrinks it is difficult to grow epitaxial material on source and drain regions for contact formation without merging the epitaxial material across adjacent fins. Further, even if the epitaxial material does not become merged across fins, non-uniformity in the thickness of epitaxial material on fin structures provides a detrimental impact to device performance.

Accordingly, it is desirable to provide integrated circuits with improved fin structures and methods for fabricating such integrated circuits. Also, it is desirable to provide integrated circuits with laterally confined epitaxial material overlying fin structures and methods for fabricating such integrated circuits. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits having laterally confined epitaxial material overlying fin structures are provided. In one exemplary embodiment, a method for fabricating an integrated circuit includes providing a fin structure overlying a semiconductor substrate. The fin structure defines a fin axis extending in a longitudinal direction perpendicular to a lateral direction and has two fin sidewalls parallel to the fin axis. The method includes forming gate structures overlying the fin structure and transverse to the fin axis. Further, the method includes growing an epitaxial material on the fin structure and confining growth of the epitaxial material in the lateral direction.

In accordance with another embodiment, a method for fabricating an integrated circuit includes providing fin structures overlying a semiconductor substrate. Each fin structure has fin sidewalls parallel to a fin axis extending in a longitudinal direction perpendicular to a lateral direction. The method includes forming gate structures overlying the fin structures and transverse to the fin axis. The method deposits a dielectric material overlying the gate structures and fin structures. The dielectric material covers selected fin structures and non-selected fin structures. Trenches are etched into the dielectric material to expose the selected fin structures. The method further includes growing epitaxial material on the selected fin structures and confining growth of the epitaxial material in the lateral direction with the dielectric material.

In another embodiment, an integrated circuit is provided. The integrated circuit includes a semiconductor substrate and a fin structure overlying the semiconductor substrate. The fin structure has two sidewalls parallel to a fin axis. The integrated circuit includes a gate structure overlying the fin structure and defining a channel region and source/drain regions in the fin structure. Further, the integrated circuit includes epitaxial material overlying the source/drain regions of the fin structure. The epitaxial material has side surfaces substantially parallel to the fin axis and substantially perpendicular to the semiconductor substrate.

BRIEF DESCRIPTION OF THE DRAWINGS

Embodiments of integrated circuits having laterally confined epitaxial material overlying fin structures and methods for fabricating such integrated circuits will be described in conjunction with the following drawing figures, wherein like numerals denote like elements, and wherein:

FIGS. 2-15 illustrate a method for fabricating an integrated circuit having laterally confined epitaxial material overlying fin structures, in accordance with an exemplary embodiment, wherein:

FIGS. 2, 4, 7, 10, and 13 are top views of the portion of the integrated circuit illustrating method steps for fabricating an integrated circuit having laterally confined epitaxial material overlying fin structures;

FIGS. 3, 5, 8, 11, and 14 are cross sectional views taken along lines 3-3, 5-5, 8-8, 11-11, and 14-14 in respective top views of the portion of the integrated circuit illustrating method steps for fabricating an integrated circuit having laterally confined epitaxial material overlying fin structures; and FIGS. 9, 12, and 15 are cross sectional views taken along lines 9-9 in FIG. 7, 12-12 in FIGS. 10, and 15-15 in FIG. 13 illustrating method steps for fabricating an integrated circuit having laterally confined epitaxial material overlying fin structures.

DETAILED DESCRIPTION

The following detailed description is merely exemplary in nature and is not intended to limit the various embodiments of the integrated circuits or the methods for fabricating integrated circuits claimed herein. Furthermore, there is no intention to be bound by any expressed or implied theory presented in the preceding technical field, background or brief summary, or in the following detailed description.

Integrated circuits having laterally confined epitaxial material overlying fin structures and methods for fabricating such integrated circuits as described herein avoid issues faced in conventional processes when forming epitaxial material over fin structures. For example, the integrated circuits and methods for fabricating integrated circuits described herein inhibit merging epitaxial material across adjacent fin structures. Further, the integrated circuits and methods for fabricating integrated circuits described herein provide fin structures having epitaxial material with a uniform width in a lateral direction that is perpendicular to the fin structures. Growth of epitaxial material over fin structures typically forms "diamond-shaped" layers having variable thicknesses due to difference in growth rates for different semiconductor planes reached during the growth of the epitaxial layer. As described herein, epitaxial material may be grown to a uniform width in the lateral direction by confining the epitaxial material during its growth. For example, a dielectric material may be deposited over the fin structures and etched to form trenches over selected fin structures. Epitaxial material grown on the selected fin structures is confined by the dielectric material defining the trenches.

FIGS. 1-15 illustrate integrated circuits and methods for fabricating the integrated circuits in accordance with an exemplary embodiment. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
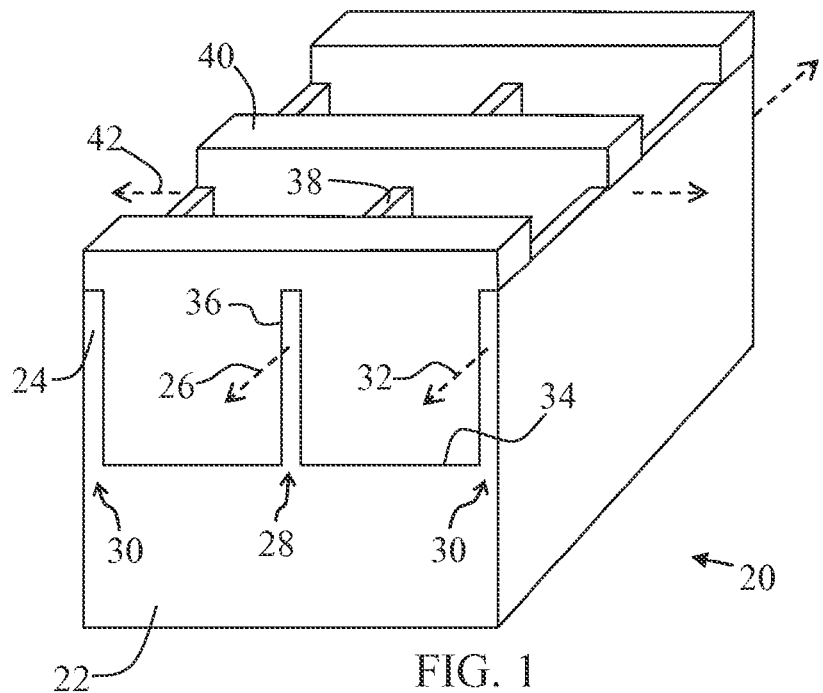
FIG. 1 is a perspective view of a portion of an integrated circuit with gate structures overlying fin structures in accordance with various embodiments herein.
Figure 2:
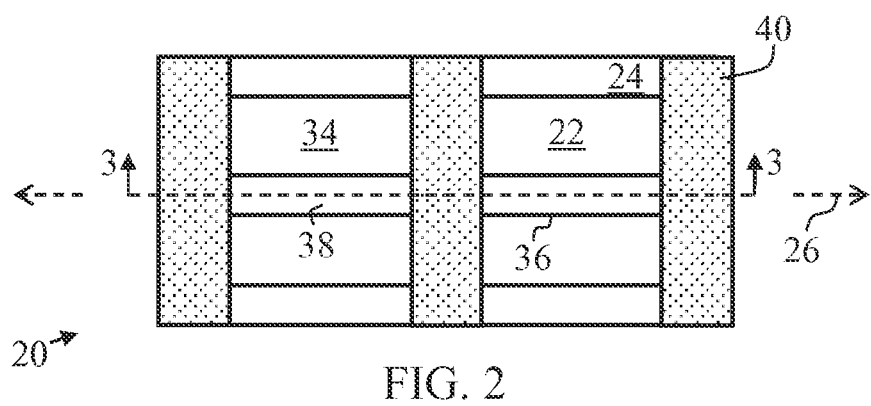
Figure 3:
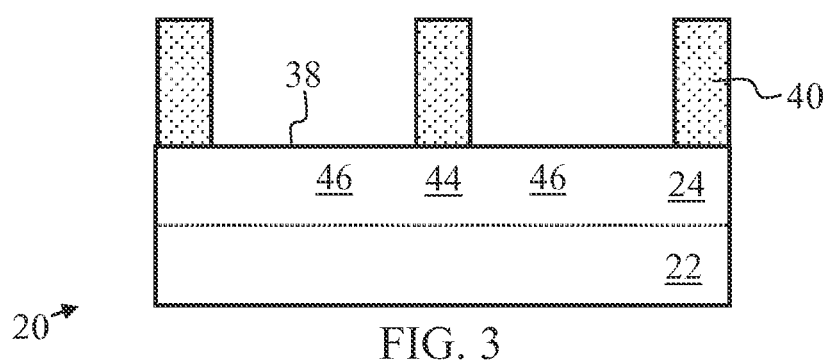

FIGS. 1, 2 and 3 illustrate a portion of an integrated circuit 20 in a perspective view, top view, and cross sectional view taken along line 2-2 in FIG. 2, respectively. In the exemplary embodiment of FIGS. 1-3, a method for fabricating an integrated circuit 20 includes providing a semiconductor substrate 22. The semiconductor substrate 22 is formed from a semiconductor material such, for example, silicon, including the relatively pure silicon materials typically used in the semiconductor industry as well as silicon admixed with other elements, such as germanium and the like. Alternatively, the semiconductor substrate 22 can be realized as germanium, gallium arsenide, and the like, or the semiconductor substrate 22 can include layers of different semiconductor materials. The semiconductor substrate 22 may be realized as a bulk silicon or silicon-on-insulator (SOI) wafer.

In the exemplary process of FIGS. 1-3, non-planar transistor structures, i.e., fin structures 24 are formed overlying the semiconductor substrate 22 and define a fin axis 26. As described below, the fin structures 24 include a selected portion 28 of fin structures 24 and a non-selected portion 30 of fin structures 24. While the selected portion 28 is illustrated to include a single fin structure and the non-selected portion 30 is illustrated to include two fin structures, it is contemplated that the portions 28 and 30 include any suitable number of fin structures for processing. The fin structures 24 extend in a longitudinal direction 32 parallel to the fin axis 26. In the exemplary embodiment of FIGS. 1-3, the fin structures 24 are formed from the semiconductor material of the semiconductor substrate 22. Specifically, an etching process recesses portions of the semiconductor substrate 22 to form a recessed surface 34 in the semiconductor substrate 22. As a result, each fin structure 24 is formed with fin sidewalls 36 and a top surface 38. While any suitable process may be used to form the fin structures 24, an exemplary embodiment uses a sidewall image transfer (SIT) process. Such a process is well-known and is not described further here. FIG. 3 includes a dashed line indicating the boundary between the fin structure 24 and the semiconductor substrate 22, though such a boundary is not physically present if the fin structure is formed from the semiconductor substrate 22.

As further shown in FIGS. 1-3, gate structures 40 are formed across the fin structures 24 and extend in a lateral direction 42 substantially perpendicular to the fin axis 26. The gate structures 40 are formed by typical lithographic processing and other methods and extend over the fin sidewalls 36 and top surfaces 38 of the fin structures 24 to the recessed surface 34 of the semiconductor substrate 22. Exemplary gate structures 40 are sacrificial gate structures formed from polycrystalline silicon. In certain embodiments, a dielectric material may be provided overlying the recessed surface 34 of the semiconductor substrate 22 such that the gate structures 40 do not lie directly on the semiconductor substrate 22. Each gate structure 40 defines a channel region 44 and source/drain regions 46 in each fin structure 24. Ion implantation may be performed using the gate as a mask to dope the channel regions 44 and source/drain regions 46 as is typical in conventional FinFET fabrication.

Figure 4:
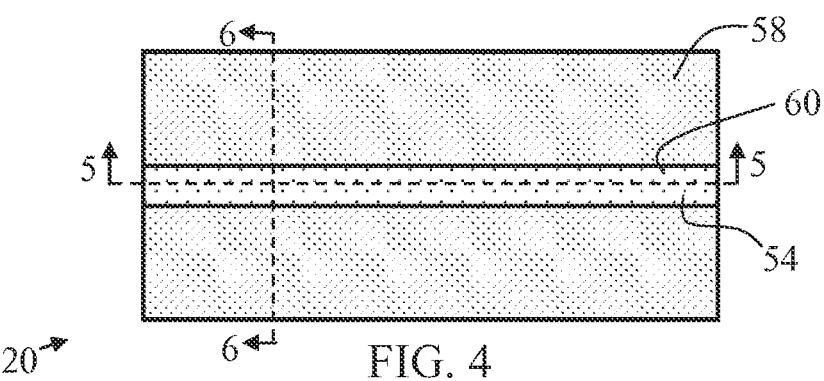
Figure 5:
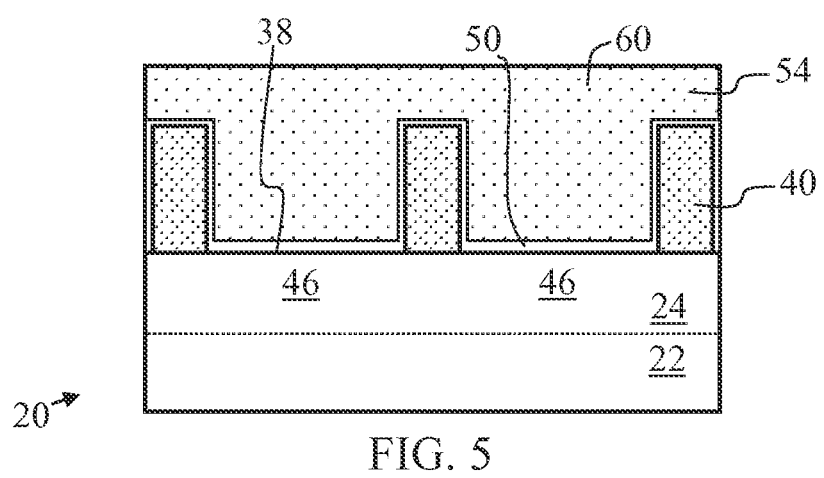
Figure 6:
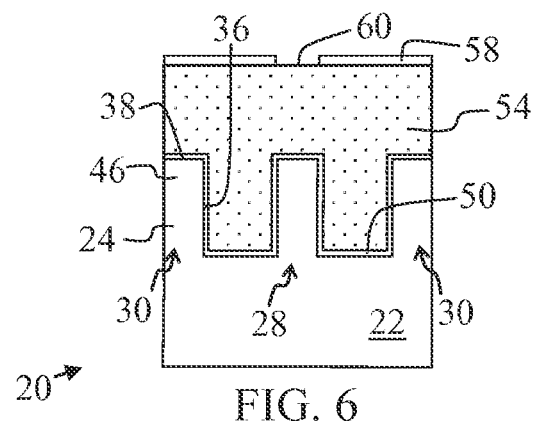

FIGS. 4-6 illustrate further processing of the integrated circuit 20 of FIGS. 1-3. FIG. 4 is a top view of the integrated circuit 20, FIG. 5 is a cross-sectional view of the integrated circuit 20 taken along line 5-5 in FIG. 4, i.e., through a fin structure 24 in the selected portion of fin structures, and FIG. 6 is a cross-sectional view of the integrated circuit 20 taken along line 6-6 in FIG. 4, i.e., through source/drain regions 46 of adjacent fin structures 24. As shown in FIGS. 5 and 6, a dielectric liner 50 is conformally deposited over the fin structures 24 and gate structures 40. The dielectric liner 50 forms along the fin sidewalls 36 and top surfaces 38 of the fin structures 24 as well as along the sides and tops of the gate structures 40. In an exemplary embodiment, the dielectric liner 50 is formed from silicon nitride, though other suitable materials may be used. An exemplary conformal deposition process is chemical vapor deposition (CVD). An exemplary dielectric liner 50 has a thickness of about 5 nm to about 30 nm, such as about 8 nm to about 20 nm.

After formation of the dielectric liner 50, a dielectric material 54 is deposited over the partially completed integrated circuit 20. An exemplary dielectric material 54 is chosen such that the dielectric material 54 may be selectively etched while the dielectric liner 50 is not etched. Therefore, the selection of the dielectric material 54 may be dependent on the material forming the dielectric liner 50 and on the selected process for etching the dielectric material 54. In an exemplary embodiment including a silicon nitride dielectric liner 50, the dielectric material 54 is silicon oxide and is deposited by chemical vapor deposition. An exemplary dielectric material 54 is blanket deposited overlying the dielectric liner 50 and is planarized by chemical mechanical planarization (CMP). Then, a mask 58 is formed overlying the dielectric material 54. The mask 58 is patterned to expose a portion 60 of the dielectric material 54 overlying the selected portion 28 of fin structures 24 and to cover the dielectric material 54 overlying the non-selected portion 30 of fin structures 24. In an exemplary embodiment, the mask is patterned by an immersion lithography process or an EUV lithography process.

Figure 7:
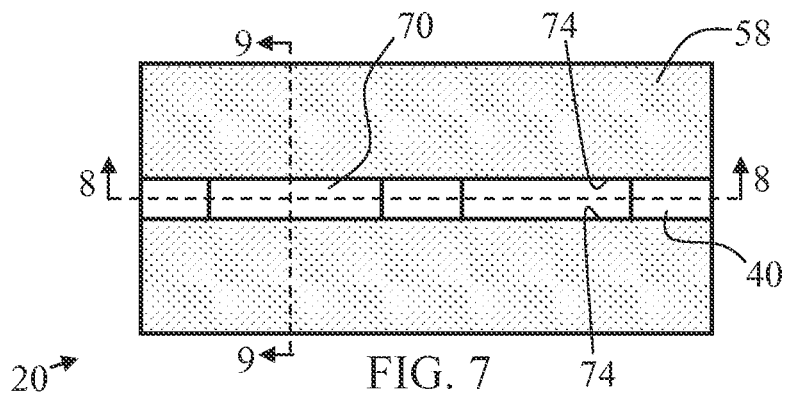
Figure 8:
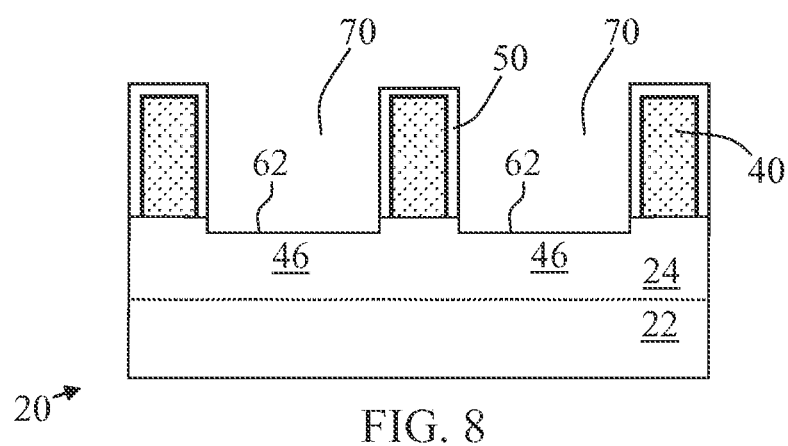
Figure 9:
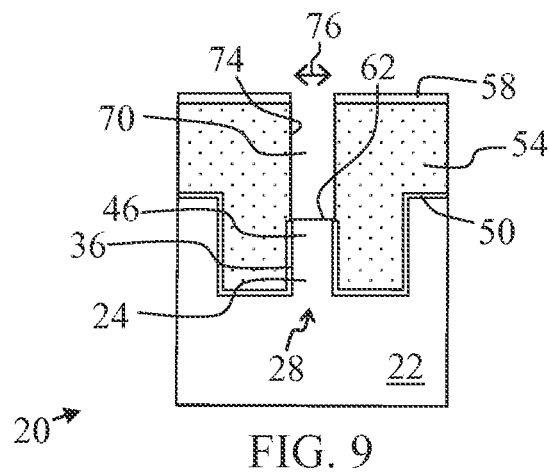

The exposed portion 60 of the dielectric material 54 is etched in FIGS. 7-9. For example, the dielectric material 54 may be etched using a reactive ion etch (RIE). FIG. 7 illustrates the top view of the resulting structure of the integrated circuit 20, FIG. 8 is a cross sectional view taken along line 8-8 in FIG. 7, and FIG. 9 is a cross sectional view taken along line 9-9 in FIG. 7. After etching the dielectric material 54, the portion of the dielectric liner 50 lying on the fin structure 24 and under the removed portion of the dielectric material 54 is etched. The dielectric liner 50 may be etched using a reactive ion etch (RIE). Removing the dielectric liner 50 exposes the source/drain regions 46 of the fin structure 24 in the selected portion 28 of fin structures 24. A silicon recess etch is performed to etch portions of the source/drain regions 46 of the fin structure 24 exposed between gate structures 40. For example, the silicon recess etch may be performed by a F-based chemistry process or a $Cl_2$-based chemistry process. The silicon recess etch results in each source/drain region 46 of the fin structure 24 having a recessed surface 62.

As illustrated clearly in FIG. 9, the etching processes result in the formation of trenches 70 bounded by barrier walls 74 of the dielectric material 54 overlying the semiconductor substrate 22. As shown, the trenches 70 are formed with a uniform width, indicated by doubled headed arrow 76. Each barrier wall 74 is aligned with a respective fin sidewall 36. An exemplary barrier wall 74 is co-planar with a respective fin sidewall 36, or parallel to a respective fin sidewall 36. An exemplary barrier wall 74 intersects and is in contact with the gate structures 40 transverse the respective fin structure 24, as indicated in FIG. 7. In one embodiment, the width 76 of the trench 70 is larger than the width of fin 28, which would take care of the overlayer variation of mask 28. The gate structures 40 are also shown to bound each trench 70, as shown in FIG. 8.

Figure 10:
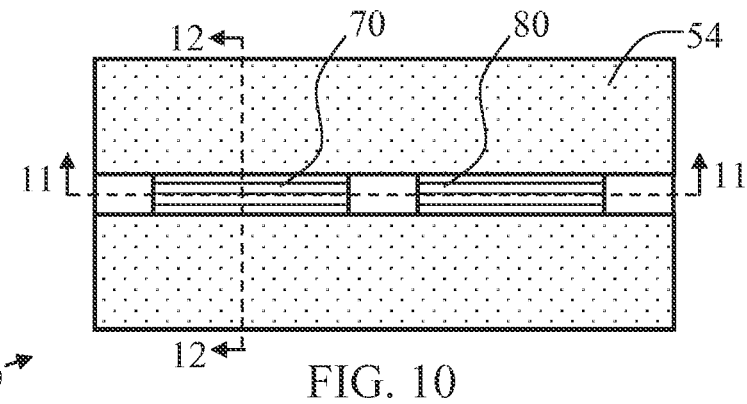
Figure 11:
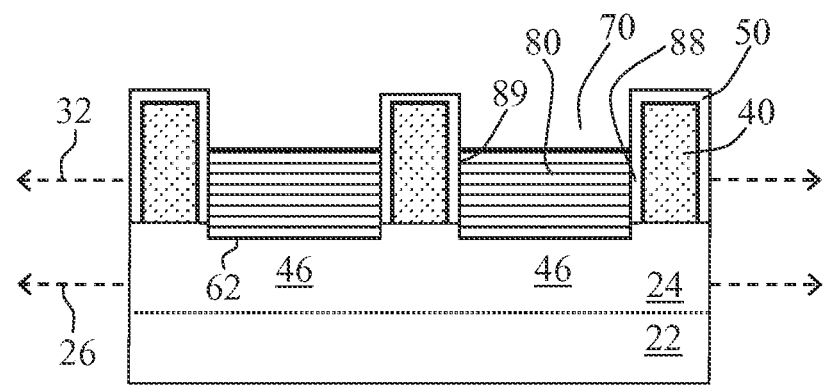
Figure 12:
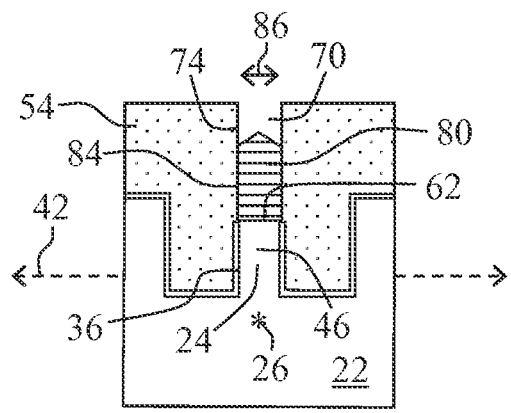

The mask 58 is removed with a conventional strip process and an epitaxial material 80 is grown in the trenches 70 in FIGS. 10-12. The sigma shaped cavity formation can be performed by wet etch process if needed. FIG. 10 illustrates the top view of the resulting structure of the integrated circuit 20, FIG. 11 is a cross sectional view taken along line 11-11 in FIG. 10, and FIG. 12 is a cross sectional view taken along line 12-12 in FIG. 10. As shown, the epitaxial material 80 is selectively grown on the silicon material of the recessed surfaces 62 of the source/drain regions 46 in fin structure 24.

As the epitaxial material 80 grows, a tendency for the epitaxial material 80 to form a diamond shape is inhibited by the shape of the trenches 70 as shown in FIGS. 11 and 12. In FIG. 12, the epitaxial material 80 grows laterally outward until it contacts the barrier walls 74 of the dielectric material 54. Then, it cannot grow laterally any farther. Thus, the barrier walls 74 of the dielectric material 54 confine growth of the epitaxial material 80 in the lateral direction 42. As a result, the epitaxial material 80 is formed with substantially planar side surfaces 84 that are parallel to the fin axis 26, coplanar with or parallel to respective fin sidewalls 36, and substantially perpendicular to the semiconductor substrate 22. Also, the epitaxial material 80 is confined by the dielectric material 54 to a uniform width, indicated by double headed arrow 86, and equal to the width 76 of the trench 70 shown in FIG. 9.

Further, as shown in FIG. 11, the gate structures 40, including the remaining portions 88 of the dielectric liner 50, confine growth of the epitaxial material 80 in the longitudinal direction 32. As a result, the epitaxial material 80 is formed with substantially planar end surfaces 89 that are substantially perpendicular to the fin axis 26, fin sidewalls 36, and semiconductor substrate 22.

Figure 13:
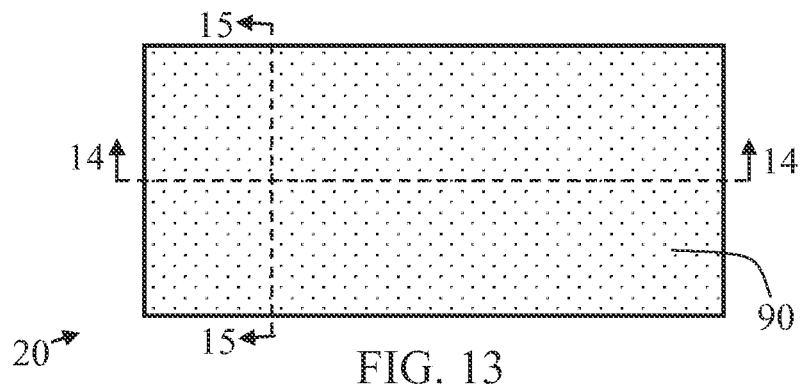
Figure 14:
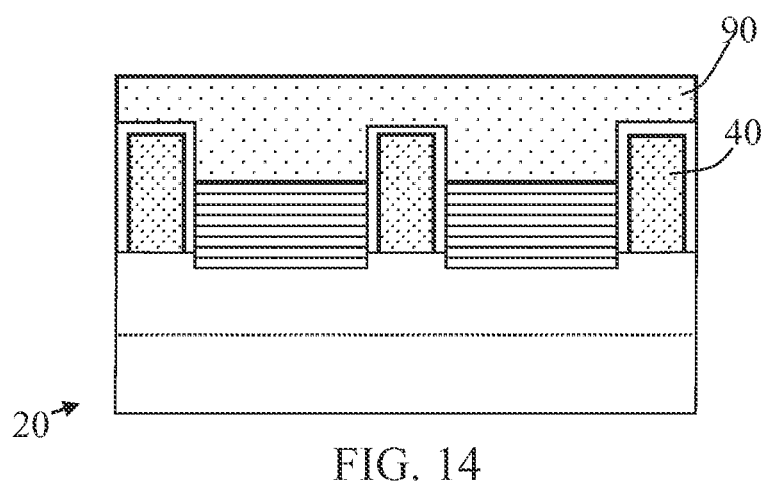
Figure 15:
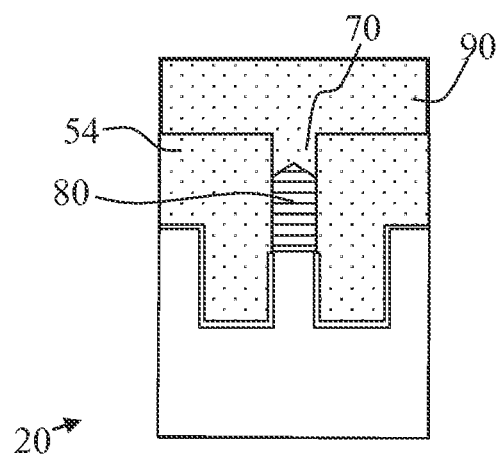

After growing the epitaxial material 80, the process continues in FIGS. 13-15 with depositing a dielectric material 90 overlying the dielectric material 54, the epitaxial material 80 and the gate structures 40 to fill the trenches 70. The exemplary dielectric material 90 is planarized such as by CMP. FIG. 13 illustrates the top view of the resulting structure of the integrated circuit 20, FIG. 14 is a cross sectional view taken along line 14-14 in FIG. 13, and FIG. 15 is a cross sectional view taken along line 15-15 in FIG. 13. After formation of the partially completed integrated circuit 20 of FIGS. 13-15, further typical processing may be performed, such as the conventional replacement metal gate processing, contact formation and connection to an interconnect structure.

As set forth above, integrated circuits and methods for fabricating integrated circuits having laterally confined epitaxial material overlying fin structures are provided. The integrated circuits and methods described herein inhibit merging of epitaxial material across fin structures. Specifically, they form trenches in dielectric material overlying selected fin structures to establish barrier walls that confine the lateral growth of epitaxial material grown in the trenches on the selected fin structures. Further, the integrated circuits and methods described herein provide for epitaxial material with a uniform lateral width formed over source/drain regions on fin structures. As a result, integrated circuit devices are formed with predictable and improved device performance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   providing a fin structure overlying a semiconductor substrate, wherein the fin structure defines a fin axis extending in a longitudinal direction perpendicular to a lateral direction, wherein the fin structure has two fin sidewalls parallel to the fin axis, and wherein the fin structure has a top surface extending between the fin sidewalls;
   forming gate structures overlying the fin structure and transverse to the fin axis; and
   growing an epitaxial material on the top surface of the fin structure while preventing growth of the epitaxial material on the fin sidewalls and confining growth of the epitaxial material over the top surface in the lateral direction.

2. The method of claim 1 further comprising confining growth of the epitaxial material in the longitudinal direction.

3. The method of claim 1 wherein:
   providing the fin structure overlying a semiconductor substrate comprises providing selected fin structures and non-selected fin structures;

forming gate structures overlying the fin structure comprises forming gate structures overlying the selected fin structures and the non-selected fin structures; and growing the epitaxial material on the top surface of the fin structure comprises growing the epitaxial material on selected fin structures while preventing growth of the epitaxial material on the non-selected fin structures.

4. The method of claim 1 further comprising forming barrier walls overlying the semiconductor substrate, wherein each barrier wall is aligned with a respective fin sidewall, wherein confining growth of the epitaxial material in the lateral direction comprises confining growth of the epitaxial material in the lateral direction with each barrier wall.

5. The method of claim 4 wherein forming barrier walls overlying the semiconductor substrate comprises forming each barrier wall in contact with each gate structure.

6. The method of claim 4 further comprising depositing a liner overlying the gate structures and the fin structure, wherein forming barrier walls overlying the semiconductor substrate comprises:
depositing a dielectric material overlying the semiconductor substrate; and
etching a trench in the dielectric material and a portion of the liner overlying the fin structure and exposing the fin structure between the gate structures, wherein the trench is defined by the barrier walls, wherein growing epitaxial material on the fin structure and confining the epitaxial material by the barrier walls comprises growing epitaxial material in the trench.

7. The method of claim 4 further comprising depositing a liner overlying the gate structures and the fin structure, wherein forming barrier walls overlying the semiconductor substrate comprises:
depositing a dielectric material overlying the semiconductor substrate; and
etching a trench in the dielectric material and a portion of the liner overlying the fin structure and exposing the fin structure between the gate structures, wherein the trench is defined by the barrier walls, wherein growing epitaxial material on the fin structure and confining the epitaxial material by the barrier walls comprises growing epitaxial material in the trench, and wherein growing epitaxial material on the fin structure and confining the epitaxial material with the barrier walls further comprises confining the epitaxial material with remaining portions of the liner adjacent the gate structures.

8. The method of claim 4 wherein forming barrier walls overlying the semiconductor substrate comprises:
depositing a dielectric material overlying the semiconductor substrate; and
etching a trench in the dielectric material and defining an exposed portion of the fin structure between the gate structures, wherein the trench is defined by the barrier walls, and wherein the method further comprises etching the exposed portion of the fin structure before growing epitaxial material on the fin structure.

9. The method of claim 4 wherein forming barrier walls overlying the semiconductor substrate comprises:
depositing a dielectric material overlying the semiconductor substrate; and
etching a trench in the dielectric material and exposing the fin structure between the gate structures, wherein the trench is defined by the barrier walls, wherein growing epitaxial material on the fin structure and confining the epitaxial material by the barrier walls comprises growing epitaxial material in the trench, and wherein the method further comprises depositing additional dielectric material in the trench over the epitaxial material.

10. The method of claim 4 further comprising depositing additional dielectric material over the epitaxial material and between the barrier walls.

11. The method of claim 4 wherein forming barrier walls overlying the semiconductor substrate comprises:
depositing a dielectric material overlying the semiconductor substrate; and
etching a trench in the dielectric material and exposing the fin structure between the gate structures, wherein the trench is defined by the barrier walls, wherein growing epitaxial material on the fin structure and confining the epitaxial material by the barrier walls comprises growing epitaxial material in the trench.

12. The method of claim 11 wherein etching a trench in the dielectric material comprises:
forming a patterned mask overlying the dielectric material to define an exposed region of the dielectric material; and
etching the exposed region of the dielectric material.

13. A method for fabricating an integrated circuit comprising:
providing fin structures overlying a semiconductor substrate, wherein each fin structure has fin sidewalls parallel to a fin axis extending in a longitudinal direction perpendicular to a lateral direction;
forming gate structures overlying the fin structures and transverse to the fin axis;
depositing a dielectric material overlying the gate structures and fin structures, wherein the dielectric material covers selected fin structures and non-selected fin structures;
etching trenches into the dielectric material to expose the selected fin structures; and
growing an epitaxial material on the selected fin structures and confining growth of the epitaxial material in the lateral direction with the dielectric material while covering the non-selected fin structures with the dielectric material.

14. The method of claim 13 wherein etching trenches into the dielectric material comprises etching portions of the selected fin structures.

15. The method of claim 13 further comprising confining growth of the epitaxial material in the longitudinal direction.

16. The method of claim 13 wherein:
etching trenches into the dielectric material comprises forming barrier walls overlying the semiconductor substrate, wherein each barrier wall is aligned with a respective fin sidewall; and
growing epitaxial material on the selected fin structures and confining growth of the epitaxial material in the lateral direction with the dielectric material comprises confining growth of the epitaxial material in the lateral direction with each barrier wall.

17. The method of claim 13 wherein etching trenches into the dielectric material comprises:
forming a patterned mask overlying the dielectric material to define exposed regions of the dielectric material; and
etching the exposed regions of the dielectric material.

18. The method of claim 13 wherein
etching trenches into the dielectric material comprises exposing top surfaces of the selected fin structures while the sidewalls of the selected fin structures remain covered by the dielectric material; and
growing the epitaxial material comprises growing the epitaxial material on the top surfaces of the selected fin structures while preventing growth of the dielectric material on the fin sidewalls and confining growth of the epitaxial material over the top surfaces in the lateral direction with the dielectric material.

19. The method of claim 18 wherein:

etching trenches into the dielectric material comprises etching the liner overlying the selected fin structures and exposing the liner overlying portions of the gate structures overlying the selected fin structures; and growing epitaxial material on the selected fin structures comprises confining growth of the epitaxial material in the longitudinal direction with the liner overlying portions of the gate structures overlying the selected fin structures.

20. An integrated circuit comprising:

a semiconductor substrate;

a fin structure overlying the semiconductor substrate and having two sidewalls parallel to a fin axis and a top surface extending between the sidewalls at a height over the semiconductor substrate;

a gate structure overlying the fin structure and defining a channel region and source/drain regions in the fin structure; and epitaxial material overlying the top surface of the fin structure at the source/drain regions, wherein the epitaxial material has side surfaces substantially parallel to the fin axis and substantially perpendicular to the semiconductor substrate, wherein each side surface extends downward from an upper edge and terminates at the height of the fin structure.

* * * * *